United States Patent

Bosselmann et al.

[11] Patent Number: 5,847,560
[45] Date of Patent: Dec. 8, 1998

[54] PROCESS AND DEVICE FOR MEASURING AN ALTERNATING ELECTRIC CURRENT WITH TEMPERATURE COMPENSATION

[75] Inventors: Thomas Bosselmann; Peter Menke, both of Erlangen, Germany

[73] Assignee: Siemens Aktiengesellschaft, München, Germany

[21] Appl. No.: 776,830

[22] PCT Filed: Aug. 25, 1995

[86] PCT No.: PCT/DE95/01138

§ 371 Date: Mar. 7, 1997

§ 102(e) Date: Mar. 7, 1997

[87] PCT Pub. No.: WO96/07922

PCT Pub. Date: Mar. 14, 1996

[30] Foreign Application Priority Data

Sep. 9, 1994 [DE] Germany ............... 44 32 146.5

[51] Int. Cl.⁶ ................................... G01R 31/00
[52] U.S. Cl. ................................ 324/96; 324/117 R
[58] Field of Search ......................... 324/96, 117 R, 324/244.1, 750, 751, 752, 753; 356/368, 367, 365, 364, 377; 250/231.1, 225, 227, 310, 311

[56] References Cited

U.S. PATENT DOCUMENTS

| 4,698,497 | 10/1987 | Miller et al. ............... 324/96 |
| 4,755,665 | 7/1988 | Ulmer, Jr. et al. ............... 250/214 |
| 4,973,899 | 11/1990 | Jones et al. ............... 324/96 |
| 5,656,934 | 8/1997 | Bosselmann ............... 324/96 |

FOREIGN PATENT DOCUMENTS

| 0 088 419 | 9/1983 | European Pat. Off. . |
| 0 557 090 | 8/1993 | European Pat. Off. . |
| WO 91/01500 | 2/1991 | WIPO . |
| WO 91/01501 | 2/1991 | WIPO . |

Primary Examiner—Vinh P. Nguyen
Attorney, Agent, or Firm—Kenyon & Kenyon

[57] ABSTRACT

Linearly polarized measuring light is broken down into two differently polarized component light signals in an analyzer after passing through a Faraday sensor device. The intensity of the corresponding electric intensity signals is normalized by dividing the respective alternating signal component by the respective direct signal component. From the two normalized intensity signals S1 and S2, a measuring signal is derived according to the formula:

$$S = (2 \cdot S1 \cdot S2)/((S2 - S1) + K \cdot (S1 + S2))$$

where $\cos(2\theta + 2\eta) = -2/(3K)$ and $\sin(2\theta - 2\eta) = 1$ are valid for a correction factor K, an injection angle $\eta$ between the plane of polarization of the injected measuring light to a natural axis of the linear birefringence in the sensor device and a exit angle $\theta$ between this natural axis and a natural axis of the analyzer.

7 Claims, 3 Drawing Sheets

PROCESS AND DEVICE FOR MEASURING AN ALTERNATING ELECTRIC CURRENT WITH TEMPERATURE COMPENSATION

The present invention relates to a process and device for measuring an alternating electric current.

BACKGROUND INFORMATION

Optical measurement methods and measurement equipment utilizing the magneto-optic Faraday effect to measure an electric current are known. The Faraday effect refers to the rotation of the plane of polarization of linearly polarized light as a function of a magnetic field. The angle of rotation is proportional to the line integral over the magnetic field along the path traversed by the light with the Verdet constant as a proportionality constant. The Verdet constant depends on the material through which the light travels and on the wavelength of the light. To measure an electric current in a current conductor, a sensor device that shows the Faraday effect is positioned near the current conductor. Such a conventional device is composed of an optically transparent material, usually glass, and may be designed with one or more solid bodies that form an optical path or with an optical fiber. Linearly polarized light is passed through the sensor device. The magnetic field generated by the electric current causes of the polarization plane of the light in the sensor device to rotate by an angle of rotation that can be interpreted by an analysis unit as a measure of the strength of the magnetic field and thus the strength of the electric current. In general, the sensor device surrounds the current conductor in such a way that the polarized light travels around the conductor in a quasi-closed circuit. In this case, the absolute value of the angle of rotation of the polarization is in good approximation directly proportional to the amplitude of the measuring current.

In an embodiment of an optical measurement device described in International Application No. 91/01501 for measuring an electric current, the sensor device is designed as part of a monomode optical fiber surrounding the conductor in the form of a measuring winding. Therefore, the polarized measuring light passes around the conductor N times at one pass, where N is the number of spires in the measuring winding. In the transmission mode, the measuring light passes through the measuring winding only once. In the reflection mode, however, the other end of the fiber is reflected so the measuring light passes through the measuring winding a second time in the opposite direction after the first pass. Therefore, because of the nonreciprocity of the Faraday effect, the angle of rotation is twice as great in the reflection mode as in the transmission mode using the same measuring winding.

European Patent No. 0 088 419 describes an optical measurement device for measuring a current, where the sensor device is designed as a solid glass ring around the conductor. Light from a light source is linearly polarized with a polarizer and then injected into the sensor device. The linearly polarized light passes through the sensor device once and then split by a Wollaston prism as a polarizing beam splitter into two components, linearly polarized component light signals A and B with polarization planes normal to each other. Each of these two light signals A and B is transmitted over a respective optical transmission fiber to a respective light detector and converted to a corresponding electric signal PA and PB. From these two signals PA and PB, a normalized intensity measuring signal $M=(PA-PB)/(PA+PB)$ is formed in a processor. This measuring signal M is independent of fluctuations in intensity of the light source or attenuation in the optical conductors.

One problem with such optical measurement processes and equipment for performing current measurements is the interference due to additional linear birefringence in the optical materials of the sensor device and the optical transmission paths. Such additional linear birefringence can be caused by mechanical stresses due to bending or vibration, for example, or by temperature changes. This linear birefringence caused by interference results in an undesirable change in operating point and measurement sensitivity.

Various conventional temperature compensation methods are already known for compensating for temperature effects.

U.S. Pat. No. 4,755,665 describes a temperature compensation process for a magneto-optic measurement device for measuring alternating currents. In this process, electric signals PA and PB that are obtained as with the measurement device described above, which is described in European Patent No. 0 088 419, are broken down in a filter into d.c. components PA(DC) and PB(DC) and a.c. components PA(AC) and PB(AC). To equalize fluctuations in intensity in the two transmission paths for light signals A and B, quotients $QA=PA(AC)/PA(DC)$ and $QB=PB(AC)/PB(DC)$ are formed from a.c. component PA(AC) or PB(AC) and d.c. component PA(DC) or PB(DC). An average over time MW(QA) and MW(QB) is formed from each of these two quotients QA and QB, and finally a quotient $Q=MW(QA)/MW(QB)$ is formed from these two averages MW(QA) and MW(QB). As part of an iteration process, a correction factor K for the resulting quotient Q is formed by comparison with calibrated values stored in a look-up table. The value QK corrected with this correction factor is used as the temperature-compensated measured value for the alternating electric current to be measured. The temperature sensitivity can be reduced to approximately $\frac{1}{50}$ with this method.

European Patent Application No. 0 557 090 describes another temperature compensation process for an optical measurement device for measuring alternating magnetic fields on the basis of the Faraday effect, so it is also suitable for measuring alternating electric currents. In this conventional process, the linearly polarized measuring light is broken down in an analyzer into two differently linearly polarized component light signals A and B after passing through a sensor device, and then to normalize the intensity for each of the two respective electric signals PA and PB, quotients $QA=PA(AC)/PA(DC)$ and $QB=PB(AC)/PB(DC)$ are formed separately from the respective a.c. component PA(AC) or PB(AC) and the respective d.c. component PA(DC) or PB(DC). Then in a central processor a measuring signal $M=1/((\alpha/QA)-(\beta/QB))$ is formed from the two quotients QA and QB with the real constants a and β that satisfy the equation $\alpha+\beta=1$. This measuring signal M is described as mostly independent of circular birefringence in the sensor device and changes in Verdet constants due to temperature fluctuations. The compensation of the temperature-induced linear birefringence is not at all described. Constants α and β are determined experimentally.

The object of the present invention is to provide a process and a device for measuring an alternating electric current using a a sensor device that exhibits the Faraday effect, where the influence of temperature-induced linear birefringence and intensity fluctuations on the measuring signal are largely compensated.

According to the present invention, linearly polarized measuring light is injected by injection devices into the optical sensor device under the influence of a magnetic field generated by the alternating electric current. In passing through the sensor device, the polarization plane of the measuring light changes as a function of the alternating electric current. After passing through the sensor device, the measuring light is split by an analyzer into two linearly polarized component light signals with different polarization planes. Then, these two component light signals are converted by optoelectric converters to corresponding electric intensity signals. Each of these two intensity signals separately undergoes a normalization of intensity by the fact that the quotient signal is formed by normalizing devices from its alternating signal component and its direct signal component. Thus, intensity fluctuations in the optical injection devices and in the transmission paths for the two component light signals can be compensated. Then, a measuring signal S for the alternating electric current I is derived by analysis devices from the two quotient signals as normalized intensity signals I1 and I2 at least approximately according to the formula:

$$S=(2\cdot S1\cdot S2)/((S2-S1)+K(S1+S2)) \quad (1)$$

where K is a real correction factor. The correction factor K, injection angle η of the plane of polarization of the measuring light injected into the sensor device to a natural axis of the linear birefringence in the sensor device, and exit angle θ between this natural axis of the linear birefringence and a natural axis of the analyzer all satisfy the following two conditions at least approximately:

$$\cos(2\theta+2\eta)=-2/(3K) \quad (2a)$$

$$\sin(2\theta-2\eta)=1. \quad (2b)$$

DETAILED DESCRIPTION OF THE INVENTION

Figure 1:
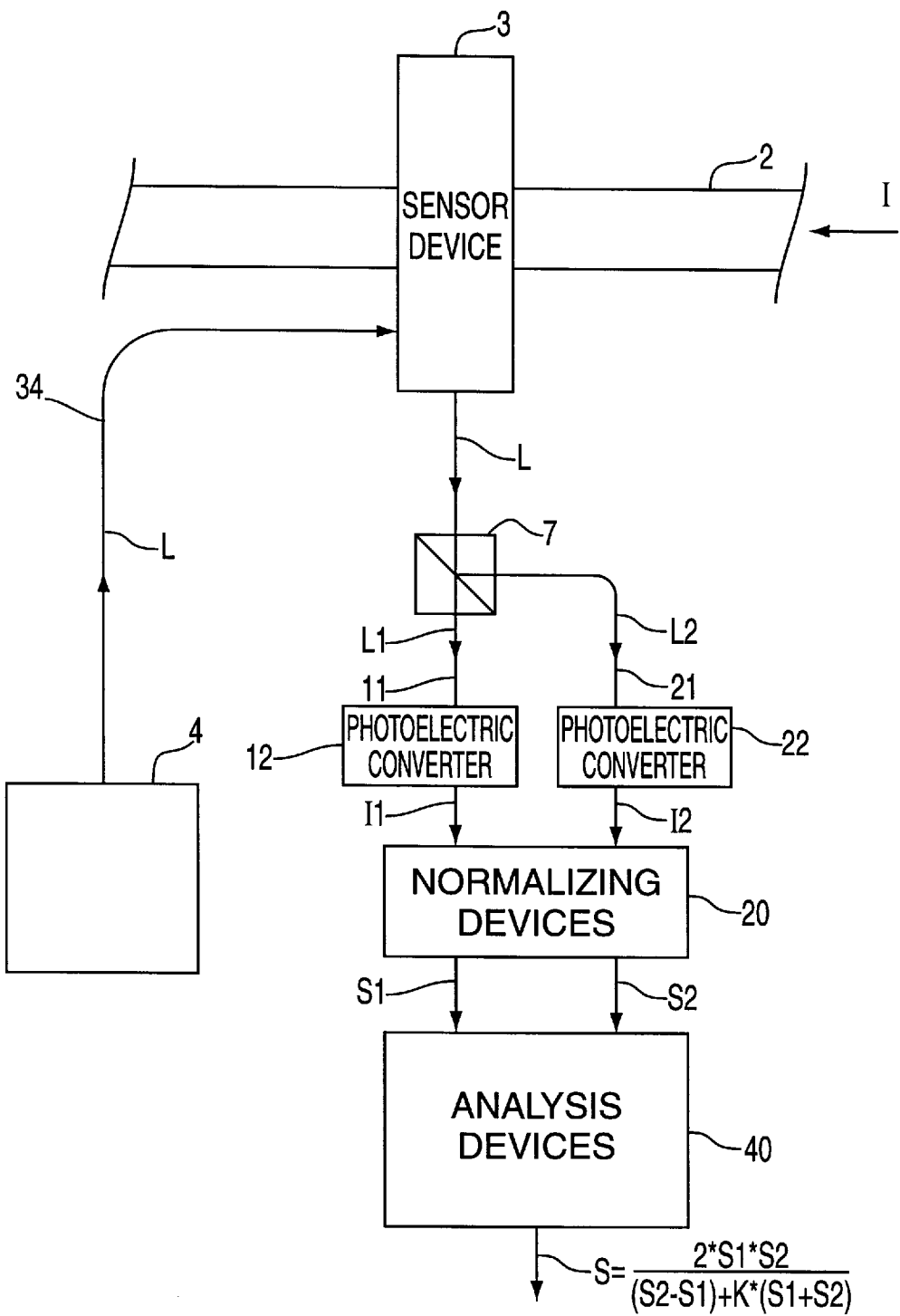
FIG. 1 shows a schematic diagram of a device according to the present invention for measuring an alternating electric current.

FIG. 1 shows a schematic diagram of one embodiment of the measurement device according to the present invention for measuring an alternating electric current I in a current conductor 2. Conductor 2 is combined with sensor device 3 that alters the polarization of linearly polarized measuring light entering sensor device 3 under the influence of the magnetic field generated by alternating electric current I as a function of alternating electric current I. Sensor device 3 consists at least partially of at least one material having a magnetooptic Faraday effect. Linearly polarized measuring light L is injected into sensor device 3. This linearly polarized measuring light L can be generated by a simple light source and respective polarizing devices (not shown), or by a self-polarizing light source 4 such as a laser diode. Sensor device 3 and light source 4 are preferably connected optically by a polarization-maintaining light guide 34, such as a monomode light fiber, e.g., a HiBi (high-birefringence) fiber or a polarization-neutral LoBi (low-birefringence) fiber. However, a multimode light guide, e.g. a light guide fiber such as those used in telecommunications may also be used. In the latter case in particular, the light of light source 4 is passed through an additional polarizer immediately before injection into sensor device 3 and linearly polarized. Linearly polarized measuring light L passes through sensor device 3 at least once, undergoing a change in polarization that depends on alternating electric current I in conductor 2. Exiting measuring light L has a plane of polarization that has been rotated by a measuring angle a (not shown) because of the Faraday effect. Measuring angle a depends on alternating current I in conductor 2.

Sensor device 3 may be formed with a light guide, preferably an optical fiber that surrounds conductor 2 in a measuring winding with at least one measuring spire. The light guide of sensor device 3 is preferably connected by a splice to light guide 34 for conducting measuring light L. However, sensor device 3 may also consist of one or more solid bodies made of Faraday materials, preferably forming a closed light path around conductor 2, e.g., a glass ring. However, sensor device 3 need not surround conductor 2 in a closed light path but may also be arranged in close proximity to conductor 2.

After passing through sensor device 3, measuring light L is sent to an analyzer 7, where it is broken down into two linearly polarized component light signals L1 and L2 having different polarization planes. The polarization planes of the two component light signals L1 and L2 are preferably aligned normal to each other (orthogonal decomposition). Polarizing beam splitters, e.g., a Wollaston prism, or two crossed polarization filters at an appropriate angle, preferably 90°, and a simple beam splitter with a partially transparent mirror may be provided as analyzer 7. Sensor device 3 and analyzer 7 may be optically connected by a free-beam arrangement or by a polarization-maintaining light guide, preferably a monomode optical fiber such as a HiBi (high-birefringence) fiber or a polarization-neutral LoBi (low-birefringence) fiber.

The two component light signals L1 and L2 are then sent to respective photoelectric converters 12 and 22. The two component light signals L1 and L2 can be transmitted from analyzer 7 to the respective converter 12 or 22 over a free-beam arrangement or preferably over a respective light guide 11 or 21 each. In converters 12 and 22 the two component light signals L1 and L2 are each converted to electric intensity signals I1 and I2, which are a measure of the intensity of the respective component light signals L1 and L2.

Electric intensity signals I1 and I2 are then sent to normalizing devices 20. Normalized intensity signals S1 and S2 are each supplied at one output of normalizing devices 20. The quotients of the alternating signal component and the direct signal component of the respective intensity signal I1 and I2 are formed as normalized intensity signals S1 and S2. The resulting normalized intensity signals S1 and S2 are compensated for fluctuations in intensity, i.e., fluctuations in the light intensities, in particular due to micro-bending losses in the light guides and due to vibrations or other mechanical effects and due to fluctuations in intensity of light source 4 are practically eliminated. Different intensity changes in the two optical transmission paths for component light signals L1 and L2 are also compensated by this intensity normalization. Therefore, a multimode fiber can also be provided as the transmission path for each of the two component light signals L1 and L2.

A problem is posed by changes in temperature owing to temperature-induced linear birefringence in the optical materials of the optical measurement device, in particular sensor device 3, and the related shift in the operating point and especially the change in measurement sensitivity of the measuring device. This temperature-induced change in measurement sensitivity is largely compensated by a temperature compensation process described below using a analysis devices 40.

To do so, two normalized intensity signals S1 and S2 are each sent to one input of analysis devices 40. From the two normalized intensity signals S1 and S2, analysis devices 40 form an output signal as measuring signal S which at least approximately satisfies equation (1) above, thus essentially corresponding to the quotient of twice the product 2-S1-S2 of the two normalized intensity signals S1 and S2 and the sum of the difference S2−S1 and the sum S1+S2 of the two normalized intensity signals S1 and S2 multiplied by a correction factor K.

Figure 4:
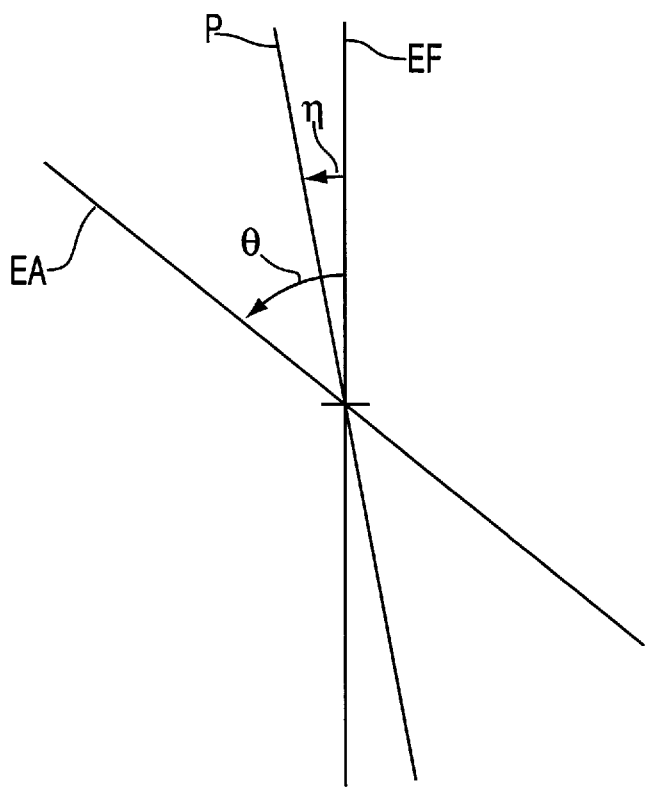
FIG. 4 show an injection angle η and a exit angle θ in a diagram.

Correction factor K is a real number that is adjusted as a function of an injection angle η (shown in FIG. 4) of polarization plane P of the linearly polarized measuring light L injected into sensor device 3 to a natural axis EF of the linear birefringence of sensor device 3 and as a function of an exit angle θ (also shown in FIG. 4) between this natural axis EF and a natural axis EA of analyzer 7 so that the aforementioned conditions (2a) and (2b) are satisfied at least approximately. It follows from equation (2a) in particular that the correction factor is described by $K \leq -\frac{2}{3}$ or $K \geq \frac{2}{3}$. A natural axis of a birefringent material is defined by the polarization condition of measuring light L that leaves the material again unchanged. In FIG. 4 the plane of the drawing defines a plane normal to the direction of propagation of measuring light L.

Deviations from the angle values that precisely satisfy the aforementioned conditions (2a) and (2b) are possible in particular in the case of high linear and/or circular birefringence of sensor device 3 and may amount to up to 5°.

Calculations have shown that with such injection angles η and exit angles θ that are selected as a function of correction factor K, measuring signal S has an especially simple dependence on the Faraday angle of rotation or measuring angle α. Then the following equation holds in good approximation:

$$S = \sin(2 \cdot \alpha) \quad (3)$$

This measuring signal S corresponds to the theoretical measuring signal for measuring angle a without birefringence effects. This makes the analysis especially simple. With a given injection angle η and exit angle θ, correction factor K is to be adjusted so that measuring signal S of the measurement device corresponds to the theoretical measuring signal when there is no birefringence. With this correction factor K, the measurement device is then adjusted for minimum temperature dependence.

If measuring light L is linearly polarized with a polarizer before being injected into sensor device 3, the angle between the natural axis of this polarizer (not shown) and a natural axis of the linear birefringence in sensor device 3 is simply selected as injection angle η.

Measuring signal S is considerably stable with respect to fluctuations in intensity of the light source and also with respect to its operating point in the optical transmission paths and with regard to its measurement sensitivity with variable temperatures. The mathematical derivation of measuring signal S according to equation (1) is preferably performed using corresponding analog components for the mathematical operations to be performed. Temperature compensation in real time is possible in this according to embodiment. However, measuring signal S can also be calculated digitally using a digital signal processor or a microprocessor and/or determined using a stored lookup table.

In addition to the embodiment according to the present invention of the transmission mode illustrated in FIG. 1, where measuring light L passes through sensor device 3 in only one direction, another embodiment of the reflection mode is also possible using the present invention, where measuring light L is reflected back into sensor device 3 after a first pass and passes through sensor device 3 a second time in the opposite direction. Linearly polarized measuring light L of light source 4 is then injected into sensor device 3 at an optical connection, preferably through a beam splitter, and after the first pass it is reflected on a mirror, passes through sensor device 3 a second time, exits again at the aforementioned connection and sent to analyzer 7 over the beam splitter.

Figure 2:
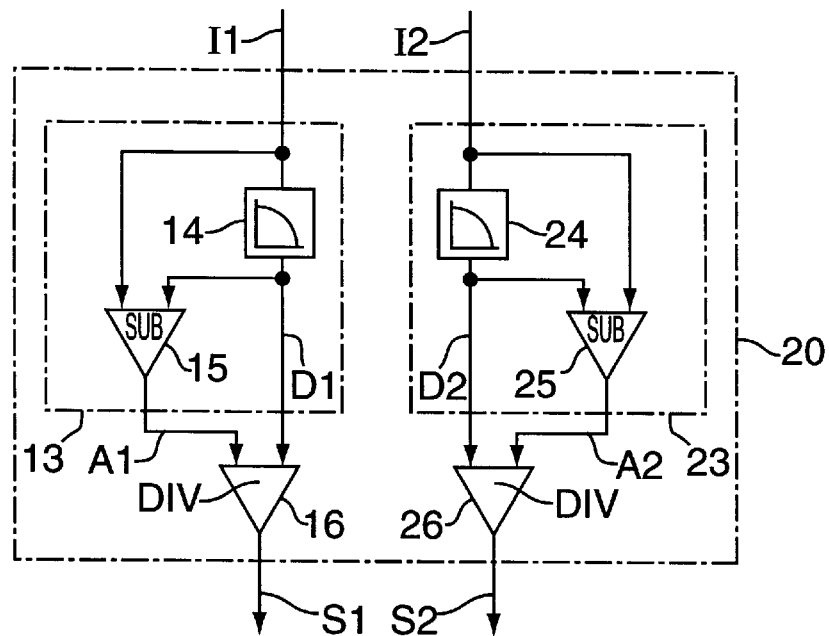
FIG. 2 shows an embodiment of normalization devices for the measurement device illustrated in FIG. 1.

FIG. 2 shows an advantageous embodiment of normalizing devices 20 according to the present invention. A first filter 13 that is connected electrically to optoelectric converter 12 is provided for breaking down the first intensity signal I1 into an alternating signal component A1 and a direct signal component D1, and a second filter 23 that is electrically connected to the second optoelectric converter 22 is provided for breaking down the second intensity signal I2 into an alternating signal component A2 and a direct signal component D2. The cutoff frequencies of the two filters 13 and 23 are set to a value such that the alternating signal components A1 and A2 of the intensity signals contain essentially all the information regarding the alternating current I to be measured. In particular, the cutoff frequency should be selected so it is lower than the fundamental frequency of alternating current I. In the embodiment illustrated in FIG. 2, each filter 13 and 23 has a lowpass filter 14 and 24 and a subtractor (SUB) 15 and 25. Intensity signal I1 or I2 is applied to an input of the respective low-pass filter 14 or 24. Then, direct signal component D1 or D2 of intensity signal I1 or I2, which corresponds to the frequency components of intensity signal I1 or I2 that are below a predetermined cutoff frequency of lowpass filter 14 or 24, is applied to an output of low-pass filter 14 or 24. The respective alternating signal component A1 or A2 is then formed simply by subtracting the direct signal component D1 or D2 from intensity signal I1 or I2 with the help of a subtractor 15 or 25. To do so, intensity signal I1 or I2 and the respective direct signal component D1 or D2 is applied to two inputs of the respective subtractor 15 or 25.

Instead of the filters 13 and 23 illustrated in FIG. 2, high-pass filters and low-pass filters can also be provided for filtering out alternating signal components A1 and A2 and direct signal components D1 and D2, or a high-pass filter can be provided for filtering out the alternating signal component A1 or A2 and a subtractor for deriving the direct signal component D1=I1−A1 and D2=I2−A2.

Alternating signal component A1 and direct signal component D1 of the first intensity signal I1 are each sent to an input of one divider 16. Then the first normalized intensity signal S1=A1/D1 is available at one output of divider 16 as the quotient of the alternating signal component A1 and direct signal component D1 of the first intensity signal I1. Likewise the alternating signal component A2 and direct signal component D2 of the second intensity signal I2 are sent to a second divider 26 that forms the normalized intensity signal S2=A2/D2 for the second intensity signal I2. The two normalized intensity signals S1 and S2 can then be picked up at corresponding outputs of normalization devices 20.

Figure 3:
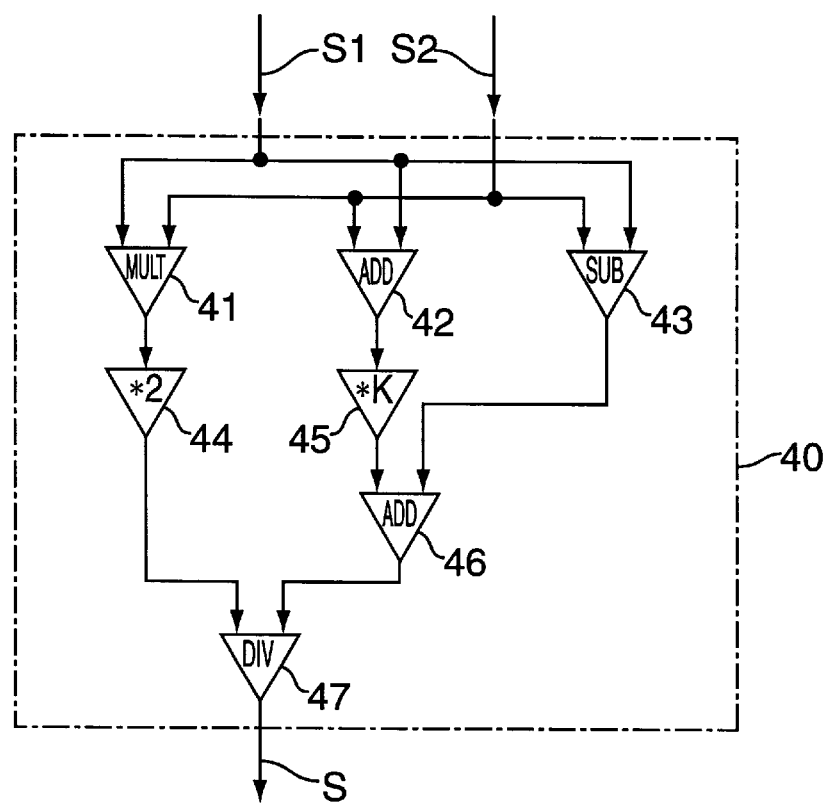
FIG. 3 shows an embodiment of analysis devices for temperature compensation for the measuring device illustrated in FIG. 1.

FIG. 3 shows an embodiment of analysis devices 40 according to the present invention, e.g., a multiplier (MULT) 41, a first adder (ADD) 42, a subtractor (SUB) 43, two amplifiers 44 and 45, a second adder (ADD) 46 and a divider (DIV) 47. The two normalized intensity signals S1 and S2 of normalization devices 20 are each sent to two inputs of multiplier 41, the first adder 42 and subtractor 43. The product S1·S2 of the two signals S1 and S2 at the output of multiplier 41 is sent to an input of amplifier 44. Amplifier 44 is set for a gain of 2, so twice the product 2·S1·S2 of the two signals S1 and S2 is supplied at its output. The sum S1+S2 of the two signals S1 and S2 at the output of the first adder 42 is sent to an input of the other amplifier 45 and boosted by correction factor K. The gain of amplifier 45 is to be set at the predetermined correction factor K. The product K·(S1+S2) at the output of amplifier 45 is sent to an input of the second adder 46. Output signal S2−S1 of subtractor 43, corresponding to the difference between the two signals S1 and S2, is applied to the other input of this adder 46. Adder 46 forms output signal K·(S1+S2)+(S2−S1) as the sum of its two input signals. Finally, output signal 2·S1·S2 of amplifier 44 is sent to the first input of divider 47, and the output signal of the second adder 46 is sent to the second input of divider 47. Divider 47 calculates the following measuring signal from these two input signals:

$$S=(2·S1·S2)/(K·(S1+S2)+(S2+S1))$$

according to equation (1). This embodiment with components similar to those in FIG. 3 has the advantage that measuring signal S is calculated especially rapidly. Thus, temperature compensation in real time is possible in combination with normalizing devices 10 shown in to FIG. 2.

The measurement process and device according to the present invention can of course also be used directly for measuring alternating magnetic fields by positioning sensor device 3 in the alternating magnetic field.

What is claimed is:

1. A method for measuring an alternating electric current by using a Faraday effect, comprising the steps of:

(a) injecting a linearly polarized measuring light into a sensor device subjected to a magnetic field generated by the alternating electric current, the measuring light having a polarization plane which is rotated as a function of the alternating electric current when passing through the sensor device;

(b) splitting the linearly polarized measuring light into two linearly polarized component light signals having different corresponding planes of polarization, the linearly polarized measuring light being split using an analyzer after passing at least once through the sensor device;

(c) converting each of the two linearly polarized component light signals into a corresponding electric intensity signal;

(d) for each of the two linearly polarized component light signals, forming a respective normalized intensity signal corresponding to a quotient of an alternating signal component and a direct signal component of the respective electric intensity signal; and (f) calculating a measuring signal S for the alternating electric current as a function of the two normalized intensity signals substantially in accordance with the formula:

$$S=(2·S1·S2)/((S2−S1)+K·(S1+S2)),$$

wherein K is a real correction factor and wherein:
   $\cos(2\theta+2\eta)=-2/(3K)$, and $\sin(2\theta-2\eta)=1$,
   where:

η is an injection angle of the plane of polarization of the measuring light injected into the sensor device with respect to a natural axis of a linear birefringence in the sensor device, and θ is an exit angle between the natural axis of the linear birefringence and a natural axis of the analyzer.

2. A device for measuring an alternating electric current, comprising:

a plurality of injection devices for injecting a linearly polarized measuring light into a sensor device subjected to a magnetic field generated by the alternating electric current, the linearly polarized measuring light having a polarization plane which is rotated as a function of the alternating electric current;

an analyzer for splitting the linearly polarized measuring light into two linearly polarized component light signals having different corresponding polarization planes, the linearly polarized measured light being split after passing at least once through the sensor device;

optoelectric converters for converting each of the two linearly polarized component light signals into a respective electric intensity signal;

normalizing devices for forming respective normalized intensity signals as a function of the respective intensity signals, the normalized intensity signals corresponding to a quotient of an alternating signal component and a direct signal component of the respective intensity signal;

analyzing devices for deriving a measuring signal for the alternating electric current as a function of the normalized intensity signals substantially in accordance with the formula:

$$S=(2·S1·S2)/((S2−S1)+K·(S1+S2)),$$

wherein K is a real correction factor and wherein:
   $\cos(2\theta+2\eta)=-2/(3K)$, and $\sin(2\theta-2\eta)=1$,
   where:

η is an injection angle of the plane of polarization of the measuring light injected into the sensor device with respect to a natural axis of a linear birefringence in the sensor device, and θ is an exit angle between the natural axis of the linear birefringence and a natural axis of the analyzer.

3. The device according to claim 2, wherein the analyzer includes a Wollaston prism.

4. The device according to claim 2, wherein the analyzer is optically connected to the optoelectric converters via two light guides corresponding to the two linearly polarized component light signals.

5. The device according to claim 4, wherein the two light guides include multimode fibers.

6. The device according to claims 2, wherein the analyzer is optically connected to the sensor device over a polarization-maintaining light guide fiber for transmitting the linearly polarized measuring light exiting the sensor device.

7. The device according to claim 2, wherein the sensor device includes a glass ring.

* * * * *